US012685177B2

(12) United States Patent
Kim

(10) Patent No.: US 12,685,177 B2
(45) Date of Patent: Jul. 14, 2026

(54) RF SWITCH DEVICE AND METHOD OF MANUFACTURING SAME

(71) Applicant: DB HiTek Co., Ltd., Bucheon-si (KR)

(72) Inventor: Hyun Jin Kim, Seoul (KR)

(73) Assignee: DB HiTek Co., Ltd., Bucheon-si (KR)

( * ) Notice: Subject to any disclaimer, the term of this patent is extended or adjusted under 35 U.S.C. 154(b) by 364 days.

(21) Appl. No.: 18/490,373

(22) Filed: Oct. 19, 2023

(65) Prior Publication Data

US 2025/0079351 A1      Mar. 6, 2025

(30) Foreign Application Priority Data

Sep. 6, 2023      (KR) ........................ 10-2023-0118060

(51) Int. Cl.
| | |
|---|---|
| *H10W 44/20* | (2026.01) |
| *H10D 30/01* | (2025.01) |
| *H10D 30/60* | (2025.01) |
| *H10D 62/10* | (2025.01) |
| *H10D 62/60* | (2025.01) |
| *H10P 14/40* | (2026.01) |

(52) U.S. Cl.
CPC ........ *H10W 44/20* (2026.01); *H10D 30/0227* (2025.01); *H10D 30/601* (2025.01); *H10P 14/414* (2026.01)

(58) Field of Classification Search
CPC ... H10W 44/20; H10W 10/30; H10W 10/031;
H10D 30/0227; H10D 30/601; H10D
30/0212; H10D 62/60; H10D 62/10;
H10D 62/113; H10D 62/114; H10P
14/414
See application file for complete search history.

(56) References Cited

U.S. PATENT DOCUMENTS

| | | | | |
|---|---|---|---|---|
| 6,440,805 | B1 * | 8/2002 | Wang | H10P 30/209 257/E21.546 |
| 6,847,089 | B2 * | 1/2005 | Chakravarthi | H10D 30/0227 257/E21.336 |
| 8,716,097 | B2 * | 5/2014 | Bordelon, Jr. | H10D 84/0191 438/380 |
| 2005/0156253 | A1 * | 7/2005 | Chui | H10D 62/151 438/207 |

FOREIGN PATENT DOCUMENTS

KR          10-1913453  B1     10/2018

* cited by examiner

*Primary Examiner* — Sonya McCall-Shepard
(74) *Attorney, Agent, or Firm* — Bridgeway IP Law Group, PLLC; Jihun Kim

(57) ABSTRACT

An RF switch device and a method of manufacturing the same deplete the lower region of the device to reduce coupling with a substrate and thereby improve RF characteristics by forming a depletion control region surrounding source and drain regions to control a depletion region while protecting a channel region within an active region where well regions such as PW and DNW are not formed.

8 Claims, 7 Drawing Sheets

RF SWITCH DEVICE AND METHOD OF MANUFACTURING SAME

CROSS REFERENCE TO RELATED APPLICATION

The present application claims priority to Korean Patent Application No. 10-2023-0118060, filed Sep. 6, 2023, which is incorporated by reference herein in its entirety.

BACKGROUND OF THE INVENTION

Field of the Invention

The present disclosure relates to an RF switch device and a method of manufacturing the same and, more particularly, to an RF switch device and a method of manufacturing the same, which deplete the lower region of the device to reduce coupling with a substrate and thereby improve RF characteristics by forming a depletion control region surrounding source and drain regions to control a depletion region while protecting a channel region within an active region where well regions such as PW and DNW are not formed.

Description of the Related Art

In general, radio frequency front-end modules (RF FEM) used in wireless communication devices such as mobile phones, smartphones, laptops, tablet PCs, PDAs, mobile gaming devices, and multi-media devices may include RF active elements, RF passive elements, RF switch elements, and control elements.

FIG. 1 is a cross-sectional view showing a conventional RF switch device.

With reference to FIG. 1, a conventional RF switch device 3 in a silicon-on-insulator (SOI) substrate will be described. A buried oxide (BOX) layer 330 is formed on a highly-resistive substrate (HRS) 310, and a silicon film (Top Si) 350 is sequentially stacked on the BOX layer (330), wherein the silicon film 350 is physically separated from the highly-resistive substrate 310 by the BOX layer 330.

RF characteristics are vital for RF switch elements. Among these, harmonic distortion is deemed the most critical. Such harmonic distortion can arise from various factors, including the properties of the substrate. Using an SOI substrate, as mentioned above, can enhance RF characteristics by reducing harmonic distortion of the substrate below the BOX layer. However, SOI substrates come at a higher cost than standard Si substrates, posing a considerable adoption barrier. As a result, there is a growing demand for an RF switch device that replicates the RF characteristics of an SOI substrate without actually using it.

DOCUMENTS OF RELATED ART (Patent Document 0001) Korean Patent No. 10-1913453 "SEMICONDUCTOR DEVICE WITH VOIDS WITHIN SILICON-ON-INSULATOR (SOI) STRUCTURE AND METHOD OF MANUFACTURING SAME"

SUMMARY OF THE INVENTION

The present disclosure has been made to solve the problems of the related art, and an objective of the present disclosure is to provide an RF switch device and a method of manufacturing the same, which effectively improve RF characteristics of the device by forming a depletion control region surrounding a source region and drain region within a highly-resistive substrate.

An objective of the present disclosure is to provide an RF switch device and a method of manufacturing the same, seeking to obtain RF characteristics similar to those of an SOI substrate by maximizing an area of a depletion region of the device using a highly-resistive Si substrate without using an SOI substrate.

An objective of the present disclosure is to provide an RF switch device and a method of manufacturing the same, which significantly improve HD2 characteristics by forming the bottom of a depletion control region to a depth less than the bottom of an adjacent device isolation film in a substrate.

An objective of the present disclosure is to provide an RF switch device and a method of manufacturing the same, which suppress the generation of hot carriers by forming an LDD region on the substrate surface side.

The present disclosure can be implemented by an embodiment having the following configuration in order to achieve the above-described objectives.

According to an embodiment of the present disclosure, there is provided a radio frequency (RF) switch device, including: a substrate; a device isolation film in the substrate; a gate electrode on the substrate; a source region on a surface side of the substrate; a drain region spaced apart from the source region on the surface side of the substrate; and a depletion control region surrounding the source region and the drain region within the substrate.

According to another embodiment of the present disclosure, in the RF switch device, the depletion control region may be formed within the substrate, extending to a depth substantially identical to that of a bottom of the device isolation film.

According to still another embodiment of the present disclosure, in the RF switch device, a bottom of the device isolation film may be positioned at a greater depth than that of the depletion control region in the substrate.

According to still another embodiment of the present disclosure, in the RF switch device, the source region and the drain region may be regions doped with an impurity of a second conductivity type, and the depletion control region may be a region doped with an impurity of a first conductivity type.

According to still another embodiment of the present disclosure, in the RF switch device, the depletion control region may be doped with the impurity of the first conductivity type at a concentration ranging from $5 \times 10^{11}$ ions/cm$^2$ to $1 \times 10^{13}$ ions/cm$^2$.

According to still another embodiment of the present disclosure, in the RF switch device, the substrate may exhibit a resistivity of 100 ohm·cm or higher.

According to still another embodiment of the present disclosure, in the RF switch device, the substrate may maintain a substantially uniform impurity concentration below the depletion control region.

According to still another embodiment of the present disclosure, the RF switch device may further include: a pair of lightly doped drain (LDD) regions in contact with the source region and the drain region on the surface side of the substrate.

According to still another embodiment of the present disclosure, in the RF switch device, the pair of LDD regions may be positioned at a shallower depth from a surface of the substrate when compared to the source region and the drain region.

According to still another embodiment of the present disclosure, the RF switch device may further include: a silicide film disposed on the source region, the drain region, and the gate electrode.

According to still another embodiment of the present disclosure, an RF switch device according to the present disclosure includes: a substrate of a first conductivity type with a resistivity of 1000 ohm·cm or higher; a device isolation film in the substrate; a gate electrode on the substrate; a source region of a second conductivity type on a surface side of the substrate; a drain region of the second conductivity type spaced apart from the source region on the surface side of the substrate; and a depletion control region of the first conductivity type surrounding the source region and the drain region within the substrate, wherein a bottom of the depletion control region may be positioned at a shallower depth within the substrate compared to a bottom of the device isolation film, and the substrate may maintain a substantially uniform impurity concentration below the depletion control region.

According to an embodiment of the present disclosure, there is provided a method of manufacturing an RF switch device, the method including: forming a device isolation film to define an active region within a substrate; forming a gate electrode on the substrate; forming a depletion control region in the active region within the substrate; and forming a source region and a drain region in the depletion control region on a surface side of the substrate.

According to another embodiment of the present disclosure, in the method of manufacturing an RF switch device, the depletion control region may extend from a surface of the substrate to a depth beneath the device isolation film.

According to still another embodiment of the present disclosure, in the method of manufacturing an RF switch device, the depletion control region is formed by injecting boron (B) or phosphorus (P) ions at a concentration ranging from $5\times10^{11}$ ions/cm$^2$ to $1\times10^{13}$ ions/cm$^2$.

According to still another embodiment of the present disclosure, the method of manufacturing an RF switch device may further include: forming an LDD region within the depletion control region and on the surface side of the substrate.

According to still another embodiment of the present disclosure, in the method of manufacturing an RF switch device, the LDD region may be positioned at a shallower depth compared to the source region and the drain region.

According to still another embodiment of the present disclosure, in the method of manufacturing an RF switch device, the substrate may maintain a substantially uniform impurity concentration below the depletion control region.

According to still another embodiment of the present disclosure, the method of manufacturing an RF switch device may further include: forming a silicide film on the source region, the drain region, and the gate electrode; and forming an interlayer insulating film to cover the gate electrode.

According to still another embodiment of the present disclosure, in the method of manufacturing an RF switch device, the depletion control region may be an impurity-doped region of a conductivity type opposite to that of the source region and the drain region.

The present disclosure has the following effects by the above configurations.

According to the present disclosure, it is possible to effectively improve RF characteristics of the device by forming a depletion control region surrounding a source region and drain region within a highly-resistive substrate.

In addition, according to the present disclosure, it is possible to obtain RF characteristics similar to those of an SOI substrate by maximizing an area of a depletion region of the device using a highly-resistive Si substrate without using an SOI substrate.

Furthermore, according to the present disclosure, it is possible to significantly improve HD2 characteristics by forming the bottom of a depletion control region to a depth less than the bottom of an adjacent device isolation film in a substrate.

Furthermore, according to the present disclosure, it is possible to suppress the generation of hot carriers by forming an LDD region on the substrate surface side.

Meanwhile, it should be added that even if effects are not explicitly mentioned herein, the effects described in the following specification expected by the technical features of the present disclosure and their potential effects are treated as if they were described in the specification of the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

As used herein, the singular form may include the plural form unless the context clearly indicates otherwise. In addition, as used herein, "comprise" and/or "comprising" specify the presence of the recited shapes, numbers, steps, operations, members, elements, and/or groups thereof, but do not exclude the presence or addition of one or more other shapes, numbers, steps, operations, members, elements, and/or groups thereof.

Hereinafter, it should be noted that when one component (or layer) is described as being disposed on another component (or layer), one component may be disposed directly on another component, or another component(s) or layer(s) may be located between the components. In addition, when one component is expressed as being directly disposed on or above another component, no other component(s) are located between the components. Moreover, being located on "top", "upper", "lower", "top", "bottom" or "one (first) side" or "side" of a component means a relative positional relationship.

The terms first, second, third, etc. may be used to describe various items such as various components, regions and/or parts. However, the items are not limited by these terms.

In addition, it should be noted that, where certain embodiments are otherwise feasible, certain process sequences may be performed other than those described below. For example, two processes described in succession may be performed substantially simultaneously or in the reverse order.

Furthermore, the conductivity type or doped region of the components may be defined as "p-type" or "n-type" according to the main carrier characteristics, but this is only for convenience of description, and the technical spirit of the present disclosure is not limited to what is illustrated. For example, hereinafter, "p-type" or "n-type" will be used as more general terms "first conductivity type" or "second conductivity type", and here, the first conductivity type means p-type, and the second conductivity type means n-type.

Furthermore, it should be understood that "high concentration" and "low concentration" expressing the doping concentration of the impurity region mean the relative doping concentration of one component and another component.

An RF switch device 1 below may be, for example, a CMOS device.

Figure 1:
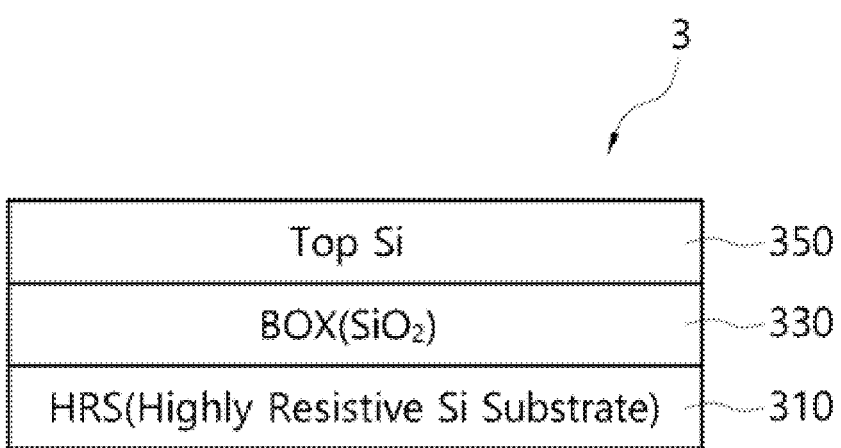
FIG. 1 is a cross-sectional view showing a conventional RF switch device.
Figure 2:
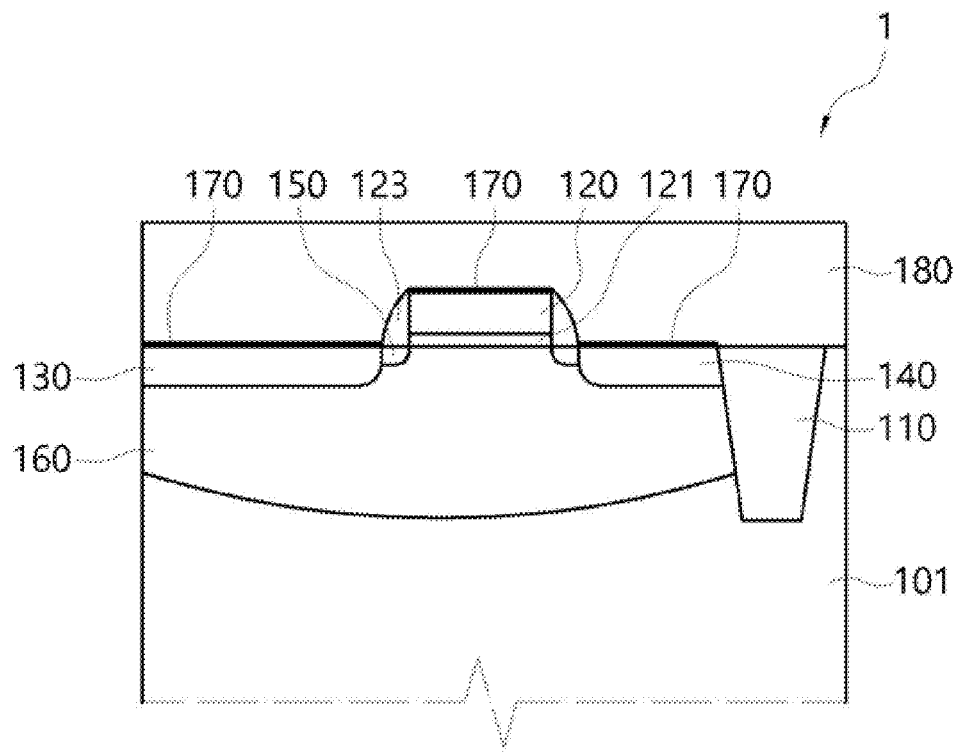
FIG. 2 is a cross-sectional view of an RF switch device according to an embodiment of the present disclosure.

FIG. 2 is a cross-sectional view of an RF switch device according to an embodiment of the present disclosure.

Referring to FIG. 2, the present disclosure relates to an RF switch device 1 and, more particularly, to an RF switch device 1 in which the lower region of the device is depleted to reduce coupling with a substrate and thereby improve RF characteristics by forming a depletion control region surrounding source and drain regions to control a depletion region while protecting a channel region within an active region where well regions such as PW and DNW are not formed.

First, in the RF switch device 1 according to the present disclosure, a highly-resistive Si substrate 101 is formed. The substrate 101 may be a silicon substrate. At this time, the resistivity of the substrate 101 is preferably approximately 100 ohm·cm or more, and more preferably, the substrate 101 is a highly-resistive substrate with the resistivity of 1,000 ohm·cm or more and 20,000 ohm·cm or less. However, it should be noted that the scope of the present disclosure is not limited thereto. The substrate 101 may be a substrate doped with a first conductivity type, may be a first conductivity type diffusion region disposed within the substrate 101, or may include an epitaxial layer epitaxially grown on the substrate 101.

In addition, an active region is formed in the substrate 101, and the active region may be defined by a device isolation film 110. The device isolation film 110 may be formed by using a shallow trench isolation (STI) process. In addition, in the active region, a separate PWELL region (PW) of the first conductivity type surrounding a source region and a drain region, or a DEEP N WELL region (DNW) below the PWELL region, is not formed. That is, in order to prevent deterioration of RF characteristics occurring in the substrate 101, it is desirable to ensure that the lower part of a depletion control region, which will be described later, is completely depleted.

A gate electrode 120 may be formed on the substrate 101. The gate electrode 120 may be formed between a source region 130 and a drain region 140 within the active region. The gate electrode 120 is positioned on a channel region, and the on and off control of the channel region is possible by the gate voltage applied to the gate electrode 120. The gate electrode 120 may be made of, for example, conductive polysilicon, metal, conductive metal nitride, and combinations thereof, and may be formed by performing a CVD, PVD, ALD, MOALD, or MOCVD process, etc., but is not limited thereto.

In addition, a gate insulation film 121 is formed between the gate electrode 120 and the surface of the substrate 101, and along the side of the gate electrode 120. The gate insulation film 121 may be formed of any one of a silicon oxide layer, a high-k layer, and a combination thereof. The gate insulation film 121 may be formed by performing an ALD, CVP, or PVD process.

The sides of the gate electrode 120 and the gate insulation film 121 may be covered by a gate spacer 123, and the gate spacer 123 may be formed of any one of a nitride film, an oxide film, and a combination thereof. As described above, a lightly doped drain (LDD) region 150 may be formed using the gate spacer 123 without using a separate ion implantation mask.

The source region 130 is formed on the surface of the substrate 101 at one end of the gate electrode 120. The source region 130 is electrically connected to a source electrode (not shown) and, for example, may be a highly concentrated impurity doped region of the second conductivity type. In addition, the drain region 140 is formed on the surface of the substrate 101 at the other end of the gate electrode 120, and the drain region 140 may be electrically connected to a drain electrode (not shown). The drain region 140 is, for example, a highly concentrated impurity doped region of the second conductivity type and may be spaced apart from the source region 130.

The LDD region 150 may be formed within the substrate 101, for example, on the surface of the substrate 101. The LDD region 150 is a pair of structures that contact the source region 130 and the drain region 140, and may be formed to face each other under the gate electrode 120. It is preferable that the pair of LDD regions 150 are formed at a shallower depth from the surface of the substrate 101 than the adjacent source region 130 and drain region 140. The LDD region 150 may be, for example, a low concentration impurity doped region of the second conductivity type. Due to the LDD region 150, the generation of hot carriers may be suppressed by alleviating the drain-gate voltage near the junction of the channel and the source region 130/drain region 140 and reducing electric potential fluctuations.

A depletion control region 160 may be formed within the substrate 101. The depletion control region 160 may be formed to surround the source region 130 and the drain region 140 within the substrate 101. The depletion control region 160 is, for example, an impurity doped region of the first conductivity type, and it is preferable that the bottom of the depletion control region 160 be formed above (or at a shallower depth) within the substrate 101 than the bottom of the device isolation film 110 or to substantially the same depth. Due to this, the substrate 101 below the device isolation film 110 and/or the depletion control region 160 may maintain the concentration of the highly-resistive substrate. That is, no additional impurities or well regions are formed below the depletion control region 160, and the impurity concentration of the substrate itself may be maintained.

Figure 3A:
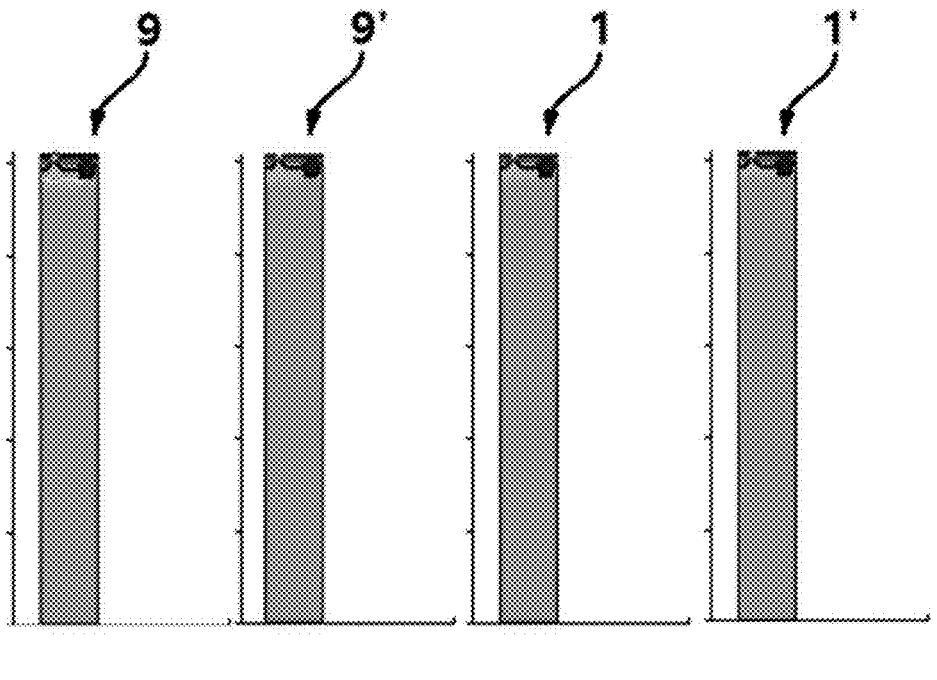
FIGS. 3A and 3B are reference diagrams for comparing 2nd harmonic distortion characteristics (HD2) of the conventional RF switch device and the RF switch device according to an embodiment of the present disclosure.
Figure 3B:
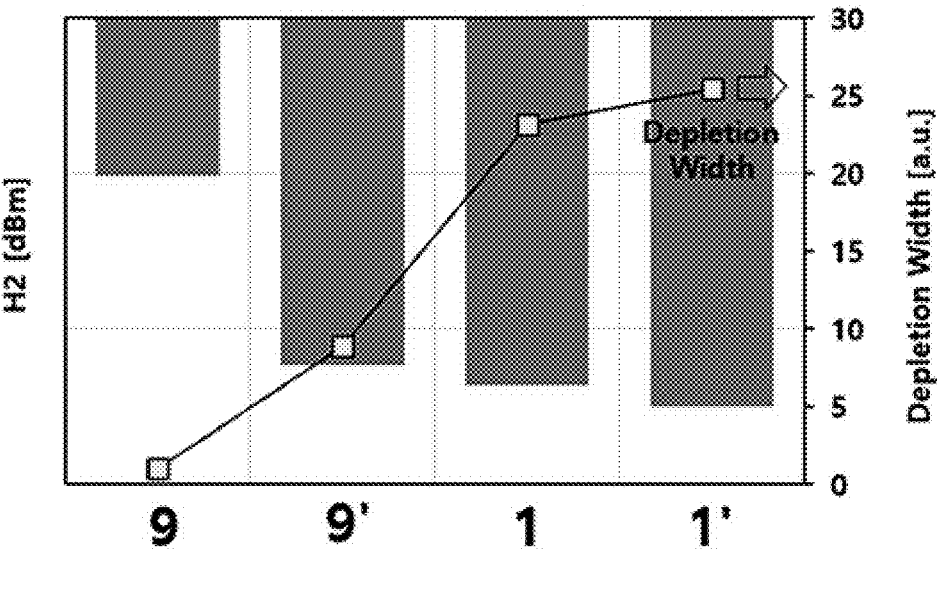

FIGS. 3A and 3B are reference diagrams for comparing 2nd harmonic distortion characteristics (HD2) of the conventional RF switch device and the RF switch device according to an embodiment of the present disclosure.

In FIGS. 3A and 3B, Comparative Example 1 shows the 2nd harmonic distortion characteristics (HD2) characteristics of a typical conventional CMOS device 9, Comparative Example 2 shows the HD2 characteristics of an RF switch device 9' in which the depletion control region 160 is formed deeper than the bottom of the device isolation film 110, Example 1 shows the HD2 characteristics of the RF switch device 1 in which the depletion control region 160 is formed to substantially the same depth as the bottom of the device isolation film 110, and Example 2 shows the HD2 characteristics of an RF switch device 1' in which the depletion control region 160 is formed shallower than the bottom of the device isolation film 110.

In Comparative Example 1, a PWELL region (PW region) of the first conductivity type is formed in the substrate of the device 9 to a position deeper than the device isolation film, and a DEEP NWELL region (DNW region) is formed below the PWELL region. In addition, a deep well region of the first conductivity type is additionally formed below the DEEP NWELL region.

Referring to 3B, in Comparative Example 2, Example 1, and Example 2, the width of the depletion region is increased compared to Comparative Example 1, and the HD2 characteristics are significantly improved. In addition, in Examples 1 and 2, the width of the depletion region is increased compared to Comparative Example 2, and the HD2 characteristics are further improved. Thus, the depletion control region 160 is preferably formed above (or at a shallower depth) within the substrate 101 than at the bottom of the device isolation film 110 or to substantially the same depth.

The depletion control region 160 is formed by an impurity ion implantation process, and boron (B) or phosphorus (P) ions are implanted at a concentration of $5\times10^{11}$ ions/cm$^2$ or more and $1\times10^{13}$ ions/cm$^2$ or less. By adjusting the depletion control region 160, the depletion region below the depletion control region 160 may be controlled. Accordingly, due to the RF switch device 1 according to an embodiment of the present disclosure, the HD2 characteristics may be improved compared to general CMOS devices.

Referring to FIG. 2, a silicide film 170 using a metal film may be formed on the source region 130, drain region 140, and gate electrode 150. Generally, in a MOSFET device, a self-aligned silicide (Salicide) process is performed to form the silicide film 170 using a metal film such as cobalt (Co), nickel (Ni), and titanium (Ti) to improve contact resistance and thermal stability.

In addition, an interlayer insulating film 180 may be formed on the substrate 101 to cover the gate electrode 120. The interlayer insulating film 180 may be formed by using, for example, a boro-phospho silicate glass (BPSG) film and a tetra ethyl ortho silicate (TEOS) film, but the scope of the present disclosure is not limited thereto.

FIGS. 4 to 13 are cross-sectional views showing a method of manufacturing an RF switch device according to an embodiment of the present disclosure.

Hereinafter, a method of manufacturing an RF switch device according to an embodiment of the present disclosure will be described in detail with reference to the attached drawings. It should be noted that the formation stage of each component may be different in time from what is described, or may be formed substantially at the same time. In addition, the manufacturing method of each component described below is only illustrative and the scope of the present disclosure is not limited thereto.

Figures 4, 5:
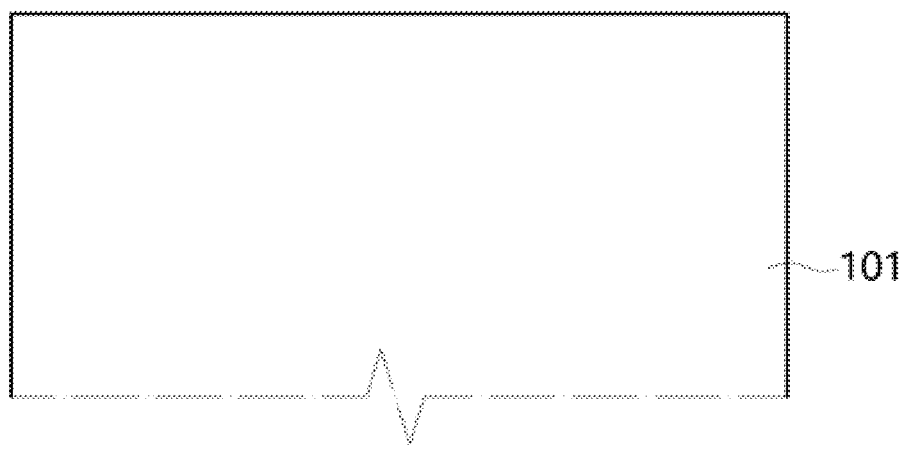
FIGS. 4 to 13 are cross-sectional views showing a method of manufacturing an RF switch device according to an embodiment of the present disclosure.

First, referring to FIG. 4, a substrate 101 is prepared. The substrate 101 is a highly-resistive substrate, and the resistivity is preferably approximately 100 ohm·cm or more, and more preferably 1,000 ohm·cm or more and 20,000 ohm·cm or less. The substrate 101 may be, for example, a first conductivity type substrate doped with boron (B) or indium (In), etc.

Thereafter, referring to FIG. 5, the active region may be defined by forming a device isolation film 110 in the substrate 101. As described above, the device isolation film 110 may be formed through, for example, an STI process.

At this time, separate well regions such as PW and DNW are not formed in a region deeper than the device isolation film 110 within the substrate 101. That is, the substrate 101 under the device isolation film 110 maintains the concentration of the highly-resistive substrate.

Figure 6:
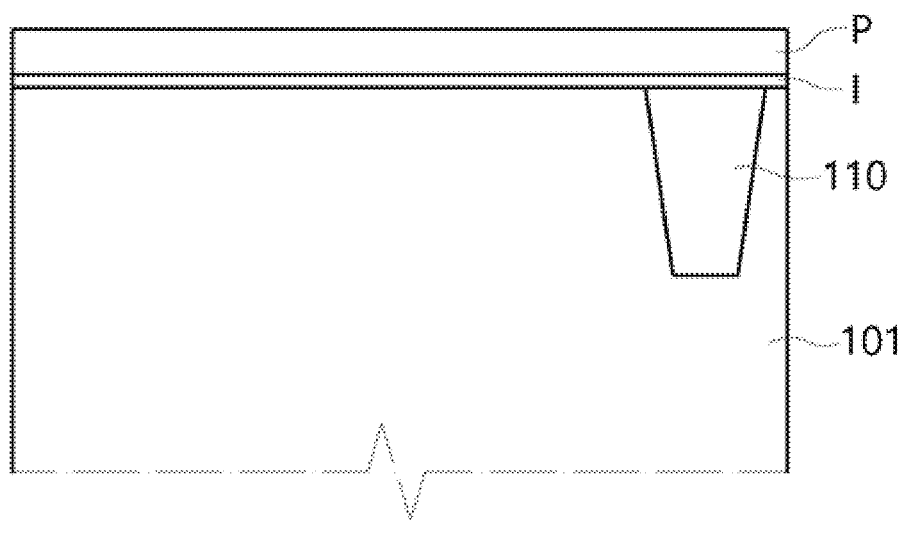

After forming the device isolation film 110, a gate region including a gate electrode 120, a gate insulating film 121, and a gate spacer 123 is formed, which will be explained in detail. Referring to FIG. 6, an insulating film layer I is formed on the substrate 101, and a gate film P is formed on the insulating film layer I. The insulating film layer I may include any one of a silicon oxide film, a high dielectric film, and a combination thereof, and the gate film P may include any one of conductive polysilicon, metal, conductive metal nitride, and combinations thereof.

Figure 7:
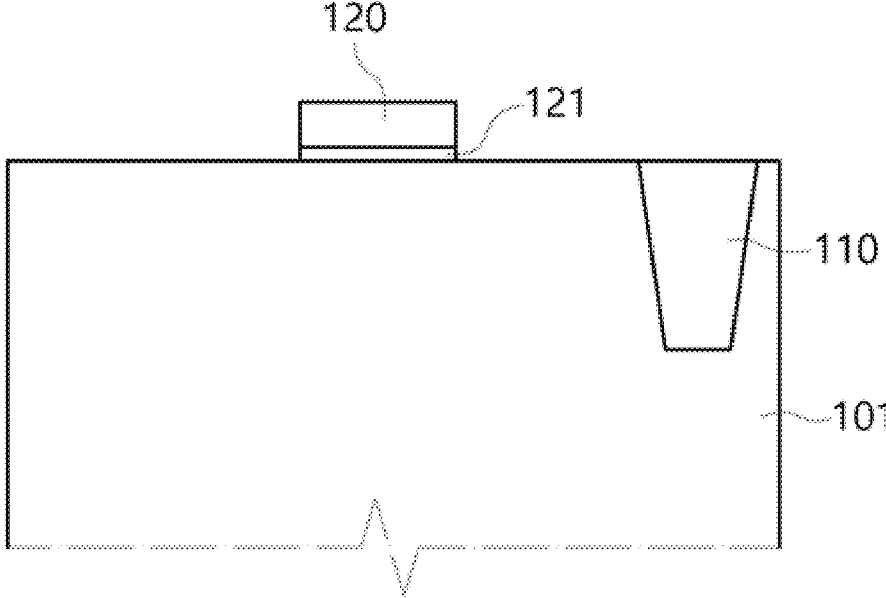

Thereafter, referring to FIG. 7, after forming a mask pattern (not shown) on the gate film P, the gate film P and the insulating film layer I are sequentially etched. Accordingly, As a result, the gate electrode 120 and the gate insulating film 121 may be formed.

Figure 8:
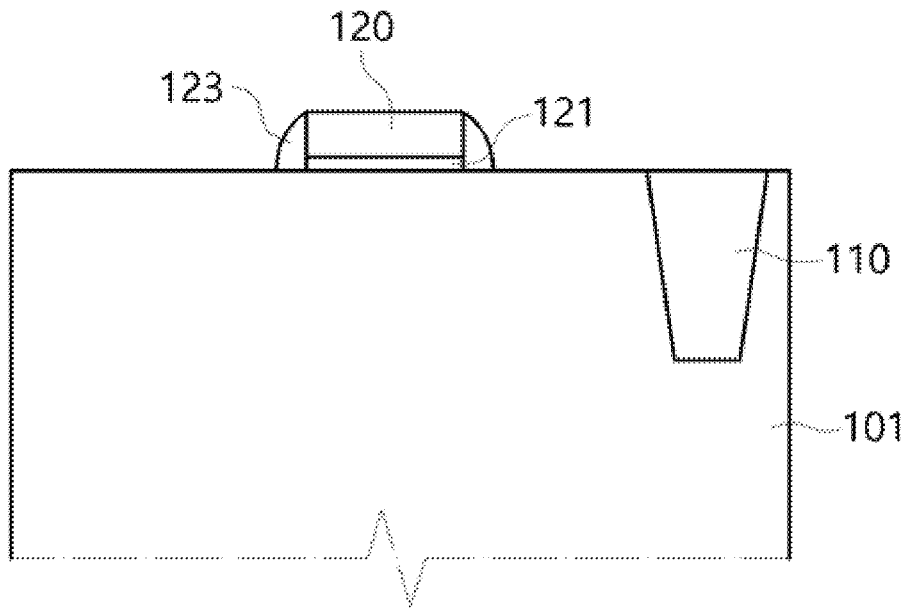

Thereafter, referring to FIG. 8, the gate spacer 123 is formed on the side of the gate electrode 120. As an example, an insulating film (not shown) may be deposited to cover the gate electrode 120 through a CVD process and an anisotropic dry etching process may be performed to form the gate spacer 123.

Figure 9:
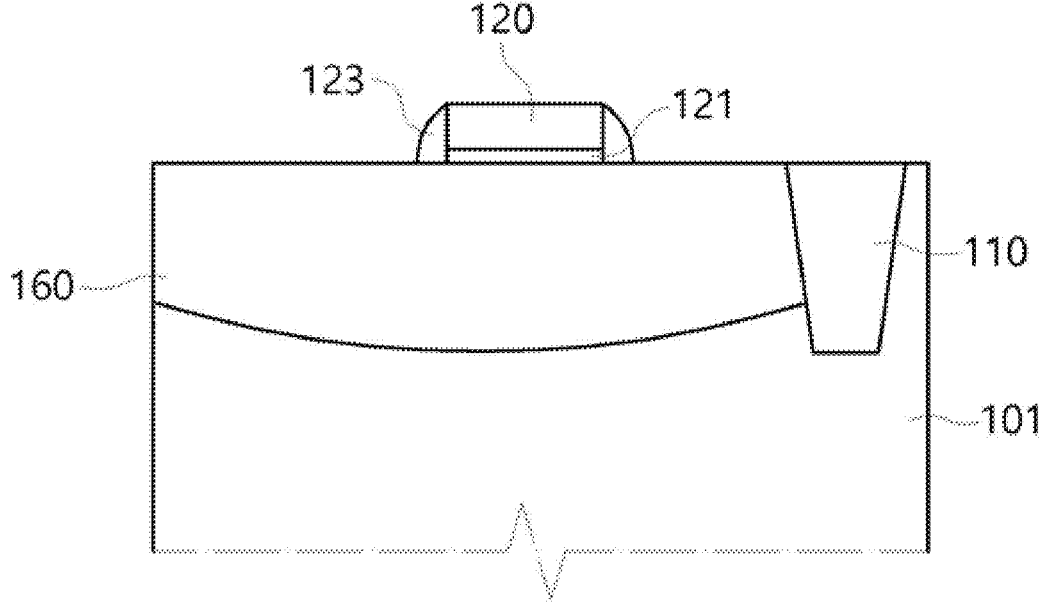

Thereafter, referring to FIG. 9, a depletion control region 160 may be formed within the substrate 101, preferably on the surface side of the substrate 101. The depletion control region 160 may be formed, for example, by implanting boron (B) or phosphorus (P) ions at a concentration of $5\times10^{11}$ ions/cm$^2$ or more and $1\times10^{13}$ ions/cm$^2$ or less. At this time, the depletion control region 160 is preferably formed from the surface of the substrate 101 to substantially the same depth as the device isolation film 110 or to a depth shallower than the device isolation film 110.

Figure 10:
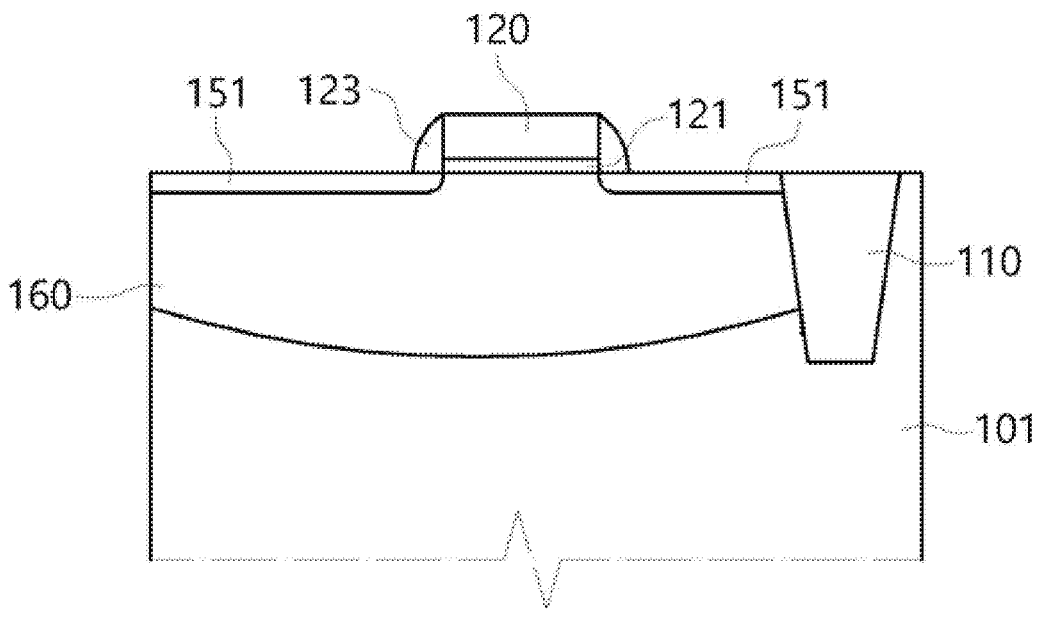

In addition, referring to FIG. 10, an impurity region 151 for forming an LDD region 150 is formed within the depletion control region 160 and on the surface of the substrate 101. The impurity region 151 of the second conductivity type may be formed by using the gate spacer 123 as an ion implantation mask. The impurity region 151 may be formed as a pair spaced apart from each other.

Figure 11:
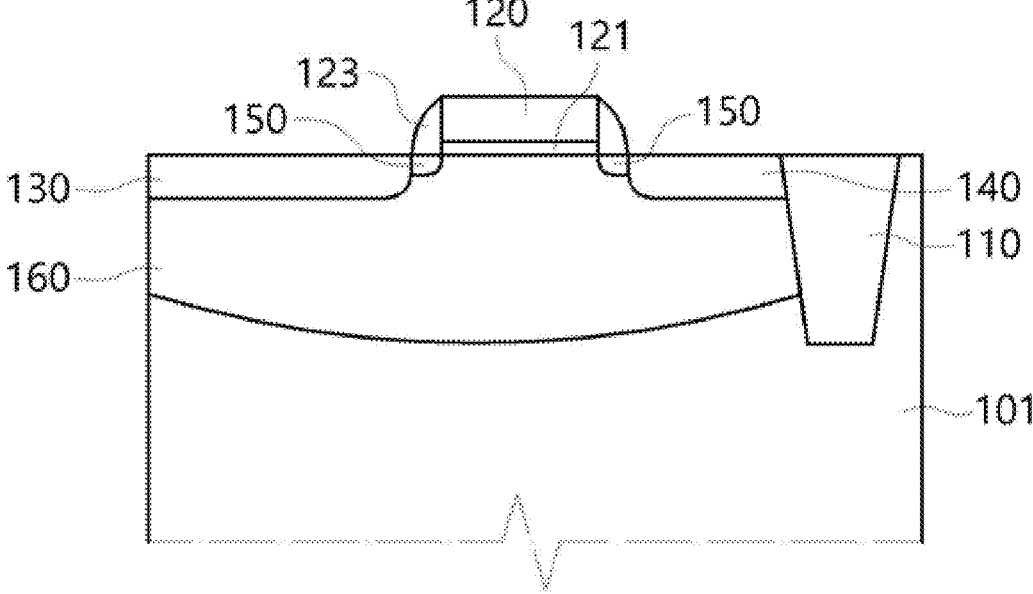

Thereafter, referring to FIG. 11, a source region 130 and a drain region 140 may be formed within the depletion control region 160 and on the surface of the substrate 101. The source region 130 and the drain region 140 are impurity doped regions of the second conductivity type and overlap with the impurity region 151. That is, the LDD region 150 may be completed by forming the source region 130 and the drain region 140. At this time, the source region 130 and the drain region 140 may be formed deep within the substrate 101 compared to the adjacent LDD region 150.

Figure 12:
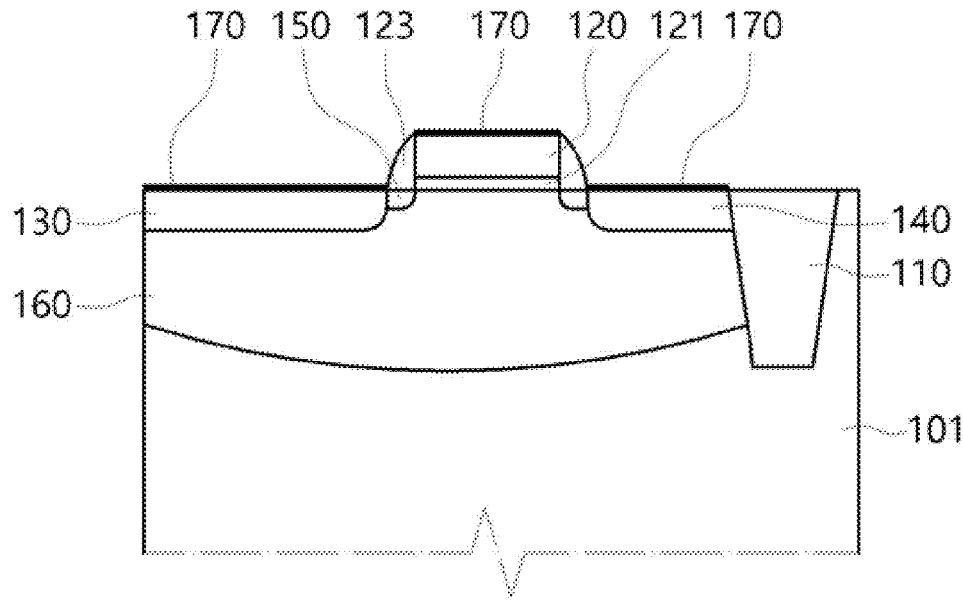

Thereafter, referring to FIG. 12, in order to improve contact resistance and thermal stability, a self-aligned silicide (Salicide) process may be performed to form a silicide film 170 on the top of the source region 130, drain region 140, and gate electrode 120 using metal films.

Figure 13:
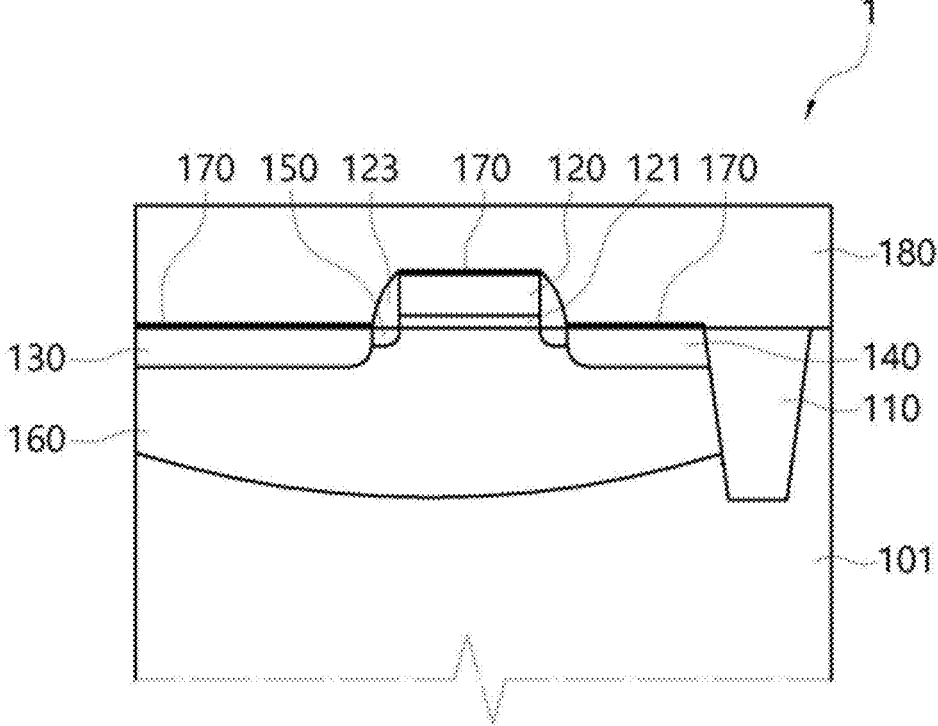

Finally, referring to FIG. 13, an interlayer insulating film 180 is deposited on the substrate 101 to cover the gate electrode 120.

The above detailed description is illustrative of the present disclosure. In addition, the above description shows and describes preferred embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiment describes the best state for implementing the technical idea of the present disclosure, and various changes required in the specific application field and use of the present disclosure are possible. Accordingly, the detailed description of the present disclosure is not intended to limit the present disclosure to the disclosed embodiments.

What is claimed is:

1. A radio frequency (RF) switch device, comprising:
a substrate;
a device isolation film disposed in the substrate, a bottom of the device isolation film being positioned at a first depth;
a gate electrode disposed on the substrate;
a source region disposed on a surface side of the substrate;
a drain region spaced apart from the source region on the surface side of the substrate; and
a depletion control region surrounding the source region and the drain region within the substrate, a bottom of the depletion control region being positioned at a second depth,
wherein the second depth of the depletion control region is less the first depth of the device isolation film such that the substrate has a substantially uniform impurity concentration below the depletion control region, and
wherein the source region and the drain region are regions doped with an impurity of a second conductivity type, and the depletion control region is a region doped with an impurity of a first conductivity type.

2. The RF switch device of claim 1, wherein the depletion control region is formed within the substrate, extending to a depth substantially identical to that of the bottom of the device isolation film.

3. The RF switch device of claim 1, wherein the depletion control region is doped with the impurity of the first conductivity type at a concentration ranging from $5 \times 10^{11}$ ions/cm$^2$ to $1 \times 10^{13}$ ions/cm$^2$.

4. The RF switch device of claim 1, wherein the substrate has a resistivity of 100 ohm·cm or higher.

5. The RF switch device of claim 1, further comprising:
a pair of lightly doped drain (LDD) regions being in contact with the source region and the drain region, respectively, on the surface side of the substrate.

6. The RF switch device of claim 5, wherein the pair of LDD regions are positioned at a shallower depth from a surface of the substrate compared to the source region and the drain region.

7. The RF switch device of claim 1, further comprising:
a silicide film disposed on the source region, the drain region, and the gate electrode.

8. An RF switch device, comprising:
a substrate of a first conductivity type with a resistivity of 1000 ohm·cm or higher,
a device isolation film disposed in the substrate;
a gate electrode disposed on the substrate;
a source region of a second conductivity type disposed on a surface side of the substrate;
a drain region of the second conductivity type spaced apart from the source region on the surface side of the substrate; and
a depletion control region of the first conductivity type surrounding the source region and the drain region within the substrate,
wherein a bottom of the depletion control region is disposed at a shallower depth within the substrate compared to a bottom of the device isolation film, and the substrate maintains a substantially uniform impurity concentration below the depletion control region, and
wherein the source region and the drain region are regions doped with an impurity of the second conductivity type, and the depletion control region is a region doped with an impurity of the first conductivity type.

* * * * *